United States Patent
Tajfar et al.

(10) Patent No.: US 12,249,470 B2
(45) Date of Patent: Mar. 11, 2025

(54) METHOD AND APPARATUS FOR ENERGY HARVESTING FROM A CURRENT SOURCE

(71) Applicant: S&C Electric Company, Chicago, IL (US)

(72) Inventors: Alireza Tajfar, Northbrook, IL (US); Todd W. Klippel, Oak Park, IL (US)

(73) Assignee: S&C Electric Company, Chicago, IL (US)

( * ) Notice: Subject to any disclaimer, the term of this patent is extended or adjusted under 35 U.S.C. 154(b) by 148 days.

(21) Appl. No.: 17/834,975

(22) Filed: Jun. 8, 2022

(65) Prior Publication Data

US 2023/0010600 A1   Jan. 12, 2023

Related U.S. Application Data

(60) Provisional application No. 63/220,288, filed on Jul. 9, 2021.

(51) Int. Cl.
*H01H 33/666* (2006.01)
*H02J 3/46* (2006.01)
*H02M 3/335* (2006.01)

(52) U.S. Cl.
CPC .... *H01H 33/6661* (2013.01); *H01H 33/6662* (2013.01); *H02J 3/46* (2013.01); *H02M 3/33507* (2013.01)

(58) Field of Classification Search
CPC ... H01H 33/6661; H01H 33/6662; H02J 3/46; H02J 2207/50; H02J 7/345; H02M 3/33507; H02M 1/0006; H02M 1/0035
(Continued)

(56) References Cited

U.S. PATENT DOCUMENTS 8,334,738 B2 * 12/2012 Smith .................. H01H 75/04
361/72
8,594,956 B2   11/2013 Banting et al.
(Continued)

FOREIGN PATENT DOCUMENTS

TW   I678871 B   * 2/2020

OTHER PUBLICATIONS

International Search Report and Written Opinion for International Application No. PCT/US2022/32585 dated Sep. 22, 2022. (10 pages).

*Primary Examiner* — Thienvu V Tran
*Assistant Examiner* — Sreeya Sreevatsa

(57) ABSTRACT

An energy harvesting circuit for harvesting energy from a medium voltage power line. The energy harvesting circuit includes an input capacitor electrically coupled to the power line and storing power therefrom, and a flyback converter including a primary coil and a secondary coil. The harvesting circuit further includes a switching circuit electrically coupled in series with the primary coil and being operable to electrically connect and disconnect the input capacitor to and from the primary coil, where the switching circuit includes an input voltage regulation feedback circuit for regulating an input voltage provided to the switching circuit from the input capacitor. The harvesting circuit also includes an output capacitor electrically coupled to the secondary coil and the actuator, where the output capacitor is charged by the secondary coil when the switching circuit is closed to provide power to an actuator to close a vacuum interrupter.

17 Claims, 3 Drawing Sheets

(58) Field of Classification Search
USPC .......................................................... 361/96
See application file for complete search history.

(56) References Cited

U.S. PATENT DOCUMENTS

| | | | |
|---|---|---|---|
| 2005/0219872 A1* | 10/2005 | Lys | H05B 45/3725 |
| | | | 363/21.04 |
| 2012/0170330 A1* | 7/2012 | Yang | H02M 1/4258 |
| | | | 363/21.13 |
| 2017/0162320 A1 | 6/2017 | Rumrill | |
| 2019/0296649 A1 | 9/2019 | Graves | |
| 2020/0028351 A1 | 1/2020 | Agliata et al. | |
| 2021/0175032 A1 | 6/2021 | Barker et al. | |
| 2022/0302697 A1* | 9/2022 | Agliata | H02J 11/00 |

* cited by examiner

METHOD AND APPARATUS FOR ENERGY HARVESTING FROM A CURRENT SOURCE

CROSS-REFERENCE TO RELATED APPLICATION

This application claims the benefit of priority from the U.S. Provisional Application No. 63/220,288, filed on Jul. 9, 2021, the disclosure of which is hereby expressly incorporated herein by reference for all purposes.

BACKGROUND

Field

This disclosure relates generally to an energy harvesting circuit that harvests energy from a medium voltage power line to provide power to an actuator to close a vacuum interrupter and, more particularly, to an energy harvesting circuit that harvests energy from a medium voltage power line.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeders including three single-phase feeder lines that carry the same current, but are 120° apart in phase. A number of three-phase and single phase lateral lines are tapped off of the feeder that provide the medium voltage to various distribution transformers, where the voltage is stepped down to a low voltage and is provided to a number of loads, such as homes, businesses, etc.

Periodically, faults occur in the distribution network as a result of various things, such as animals touching the lines, lightning strikes, tree branches falling on the lines, vehicle collisions with utility poles, etc. Faults may create a short-circuit that increases the stress on the network, which may cause the current flow to significantly increase, for example, many times above the normal current, along the fault path. This amount of current causes the electrical lines to significantly heat up and possibly melt, and also could cause mechanical damage to various components in the network. These faults are often transient or intermittent faults as opposed to a persistent or bolted fault, where the thing that caused the fault is removed a short time after the fault occurs, for example, a lightning strike. In such cases, the distribution network will almost immediately begin operating normally after a brief disconnection from the source of power.

Power distribution networks of the type referred to above typically include a number of switching devices, breakers, reclosers, interrupters, etc. that control the flow of power throughout the network. A vacuum interrupter is a switch that has particular application for many of these types of devices. A vacuum interrupter employs opposing contacts, one fixed and one movable, positioned within a vacuum enclosure. When the vacuum interrupter is opened by moving the movable contact away from the fixed contact to prevent current flow through the interrupter the arc that is created between the contacts is extinguished by the vacuum at the next zero current crossing. A vapor shield is typically provided around the contacts to collect the emitted metal vapor caused by the arcing. In some designs, the vacuum interrupter is encapsulated in a solid insulation housing that has a grounded external surface.

Fault interrupters that employ vacuum interrupters, for example, pole mounted single-phase self-powered magnetically actuated reclosers, are provided on utility poles and in underground circuits along a power line and have a switch to allow or prevent power flow downstream of the recloser. These types of magnetically actuated reclosers generally include a solenoid type actuator having an armature that is moved by an opening coil to open the vacuum interrupter and a closing coil to close the vacuum interrupter, where the armature and a stator provide a magnetic path for the flux produced by the coils. The coils are de-energized after the actuator is moved to the open or closed position, and permanent magnets are used to hold the armature against a latching surface in the open or closed position. Reclosers of this type automatically open the vacuum interrupter contacts in response to the detection of fault current, and are often coordinated with other reclosers and breakers so that the first recloser upstream of the fault is the only one that opens to limit the number of loads that do not receive power.

These reclosers typically detect the current and/or voltage on the line to monitor current flow and have controls that indicate problems with the network circuit, such as detecting a high current fault event. For example, a vacuum interrupter may employ a Rogowski coil, well known to those skilled in the art, that is wrapped around the power line and measures current flow on the line by means of the voltage that is induced in the coil being proportional to the rate of change of current flow. If such a high fault current is detected the recloser is opened in response thereto, and then after a short delay closed to determine whether the fault is a transient fault. If high fault current flows when the recloser is closed after opening, it is immediately re-opened. If the fault current is detected a second time, or multiple times, during subsequent opening and closing operations indicating a persistent fault, then the recloser remains open, where the time between detection tests may increase after each test.

It has become increasingly more popular to replace the traditional fuse with a fault interrupting or reclosing device at the location where a distribution line is tapped off of a lateral line just before the distribution transformer so as to reduce the number of service calls to replace fuses in response to temporary faults that can be cleared by the fault interrupting device. One of those devices used for this purpose is known as the VacuFuse™ transformer protector, available from S&C Electric Company, Chicago, Illinois, USA.

Energy harvesting that provides the self-power in these types of fault interrupters is typically provided by current transformers and storage capacitors, which have significant size and weight in order to provide the necessary power to actuate the vacuum interrupter contacts. For example, the current transformers are typically large to harvest enough energy to quickly open the actuator for a fault, as well as store enough energy for the subsequent close operation. Also, the type of energy storage devices is limited because of the amount of energy to be stored, such as not being able to use film capacitors. Further, the speed at which the fault interrupters can clear a fault is reduced because of the size of the energy storage devices. It is desirable to reduce the size and weight of these types of fault interrupters for a number of reasons, such as increasing the ability to install and remove the switches from the pole on which they are mounted using a hot stick.

SUMMARY

The following discussion discloses and describes an energy harvesting circuit for harvesting energy from a power line to provide power to an actuator to close a vacuum interrupter. The energy harvesting circuit includes an input capacitor electrically coupled to the power line and storing energy therefrom, and a power converter including a primary coil and a secondary coil. The energy harvesting circuit further includes a switching circuit electrically coupled in series with the primary coil and being operable to electrically connect and disconnect the input capacitor to and from the primary coil, where the combination of the primary coil and the switching circuit is in parallel with the input capacitor. The switching circuit includes an input voltage regulation feedback circuit for regulating an input voltage provided to the switching circuit from the input capacitor, where the input feedback circuit includes an integrated circuit including a feedback pin, a first switch, a pulse width modulation (PWM) controller and a comparator, where when a feedback voltage provided to the feedback pin is below a reference voltage, a high signal is generated at an output of the comparator, which triggers the PWM controller to generate a PWM signal that turns on the first switch so that power is provided to the primary coil from the input capacitor, and when the feedback voltage at the feedback pin is above the reference voltage, the PWM signal is stopped. The energy harvesting circuit also includes an output capacitor electrically coupled to the secondary coil and the actuator, where the output capacitor is charged by the secondary coil when the switcher circuit is closed to provide power to the actuator to close the vacuum interrupter.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to an energy harvesting circuit that harvests energy from a medium voltage power line to provide power to an actuator to close a vacuum interrupter is merely exemplary in nature, and is in no way intended to limit the disclosure or its applications or uses. For example, the discussion herein refers to the energy harvesting circuit harvesting energy to power an actuator to close a vacuum interrupter in a recloser associated with a distribution transformer. However, as will be appreciated by those skilled in the art, the energy harvesting circuit will have other applications.

Figure 1:
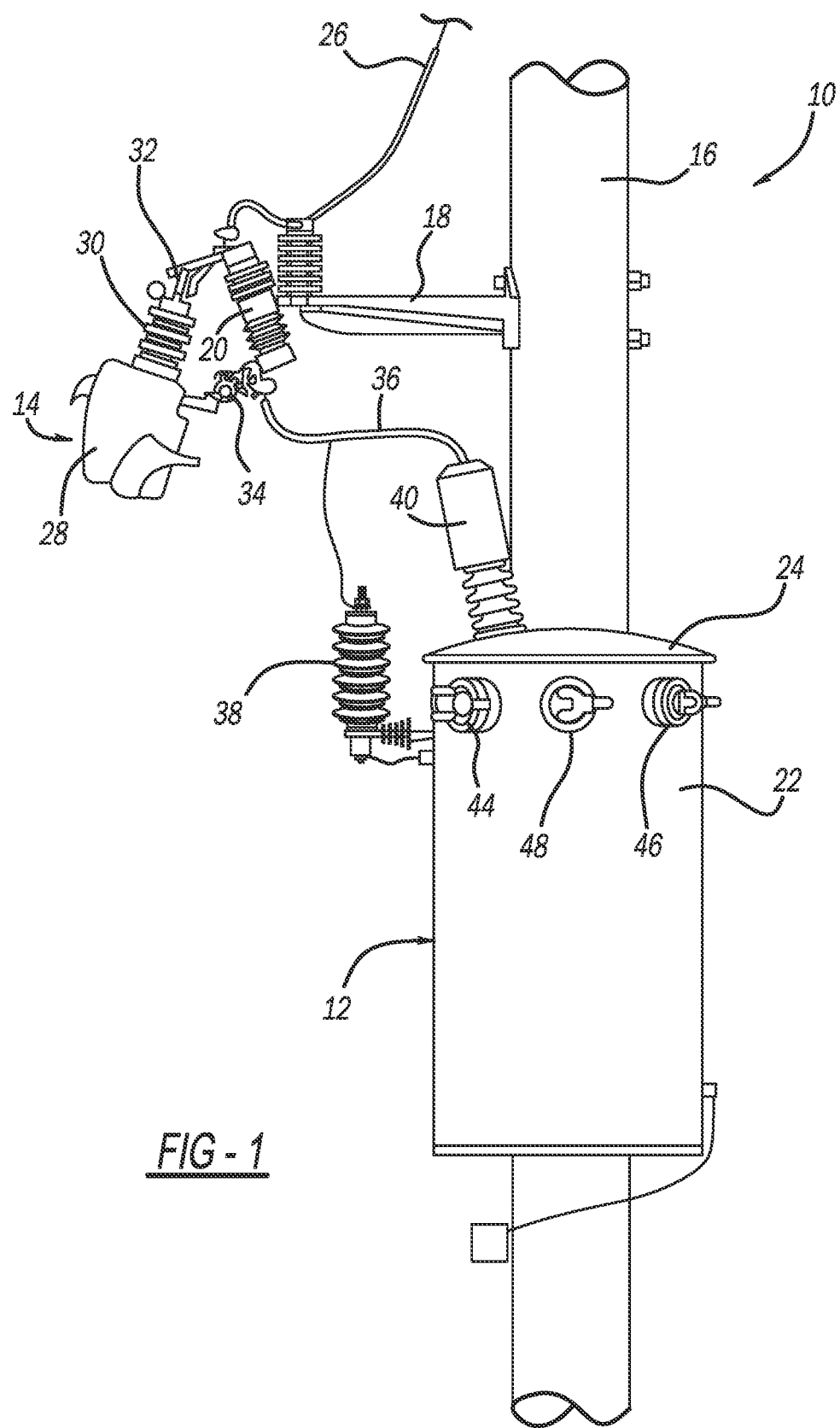
FIG. 1 is an illustration of a pole mounted transformer system including a distribution transformer and a recloser.

FIG. 1 is an illustration of a pole mounted transformer system 10 including a distribution transformer 12 mounted to a utility pole 16 and a cut-out mounted recloser 14 mounted to the utility pole 16 by a mount 18 and an insulator 20, where the recloser 14 replaces the traditional fuse. The transformer 12 includes an outer tank or can 22 having a cover or lid 24 typically filled with oil that houses the primary and secondary coils and the transformer core assembly. The transformer 12 will have a certain size and power rating based on the amount of load it services, a primary voltage at the terminals of the primary coil during normal operation, a normal base current based on that voltage and a current overload percentage that allows the transformer 12 to operate a certain percentage above its normal load for a certain amount of time. The recloser 14 is intended to represent any reclosing or fault interrupting device of the type discussed above, such as a single phase self-powered magnetically actuated recloser that employs a vacuum interrupter, suitable for performing reclosing operations at a location where a power distribution line 26 is tapped off of a lateral line (not shown). The recloser 14 includes a vacuum interrupter 30 and an enclosure 28 housing all of the actuators, electronics, components, sensors for measuring and harvesting current, controllers, processors, communications devices, etc. for operating the recloser 14 as discussed herein. If the fault is permanent and the interrupting and reclosing sequence is unable to remove the fault, the recloser 14 will be released from a connector 32 and pivot on a hinge 34 to provide a visual indication that is has operated.

The power distribution line 26 at medium voltage is electrically coupled to one terminal of the recloser 14 and a power line 36 at medium voltage is electrically coupled to the other terminal of the recloser 14 and the primary winding in the transformer 12 through a bushing 40, where the bushing 40 includes an internal conductor and an outer insulation body. A surge arrester 38 is coupled to the line 36 and the can 22 to provide over-voltage protection from, for example, lightning strikes. The transformer 12 steps down the medium voltage on the line 36 to a lower voltage, and, in this example, provides 120 volt power at a terminal 44 or 46 and a ground terminal 48 and 240 volt power between the terminals 44 and 46, where the ground terminal 48 is electrically coupled to a neutral line (not shown) in most applications.

Figure 2:
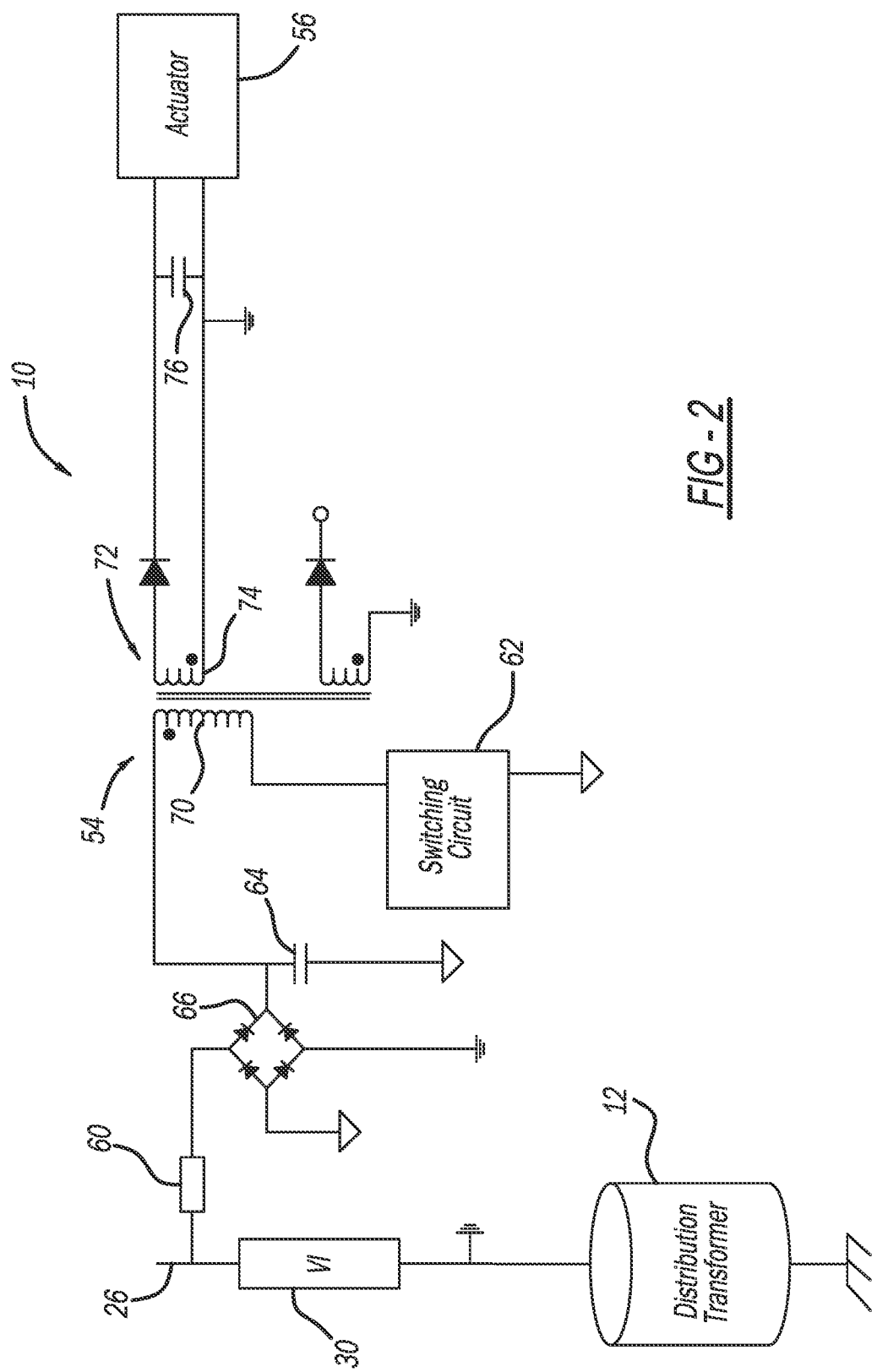
FIG. 2 is a schematic diagram of an energy harvesting circuit associated with the recloser in the system shown in FIG. 1.

FIG. 2 is a schematic diagram of a portion of the system 10 showing an energy harvesting circuit 54 that is provided within the housing 28 and an actuator 56, such as a magnetic actuator, that is also provided in the housing 28 and is operable to close the vacuum interrupter 30 either initially when the recloser 14 is installed or during a reclosing operation. The energy harvesting circuit 54 is coupled to the medium voltage line 26 and the actuator 56 and harvests energy from the leakage current provided from the voltage developed across a high-voltage resistor 60 coupled in parallel with the vacuum interrupter 30 when it is open to operate the actuator 56 to close the vacuum interrupter 30. More specifically, the energy harvesting circuit 54 includes a switching circuit 62 that is self-powered from the voltage developed across an energy storage input capacitor 64, for example, a film capacitor, that is charged through a full-bridge diode rectifier 66 that converts AC to DC. When the switching circuit 62 is closed power is provided to a primary coil 70 of a flyback converter 72. Power is then transferred to a secondary coil 74 of the converter 72, which provides power to charge an output storage capacitor 76, for example, a film capacitor, and provide a source of power for the actuator 56 to perform the closing operation when the vacuum interrupter 30 is open.

Figure 3:
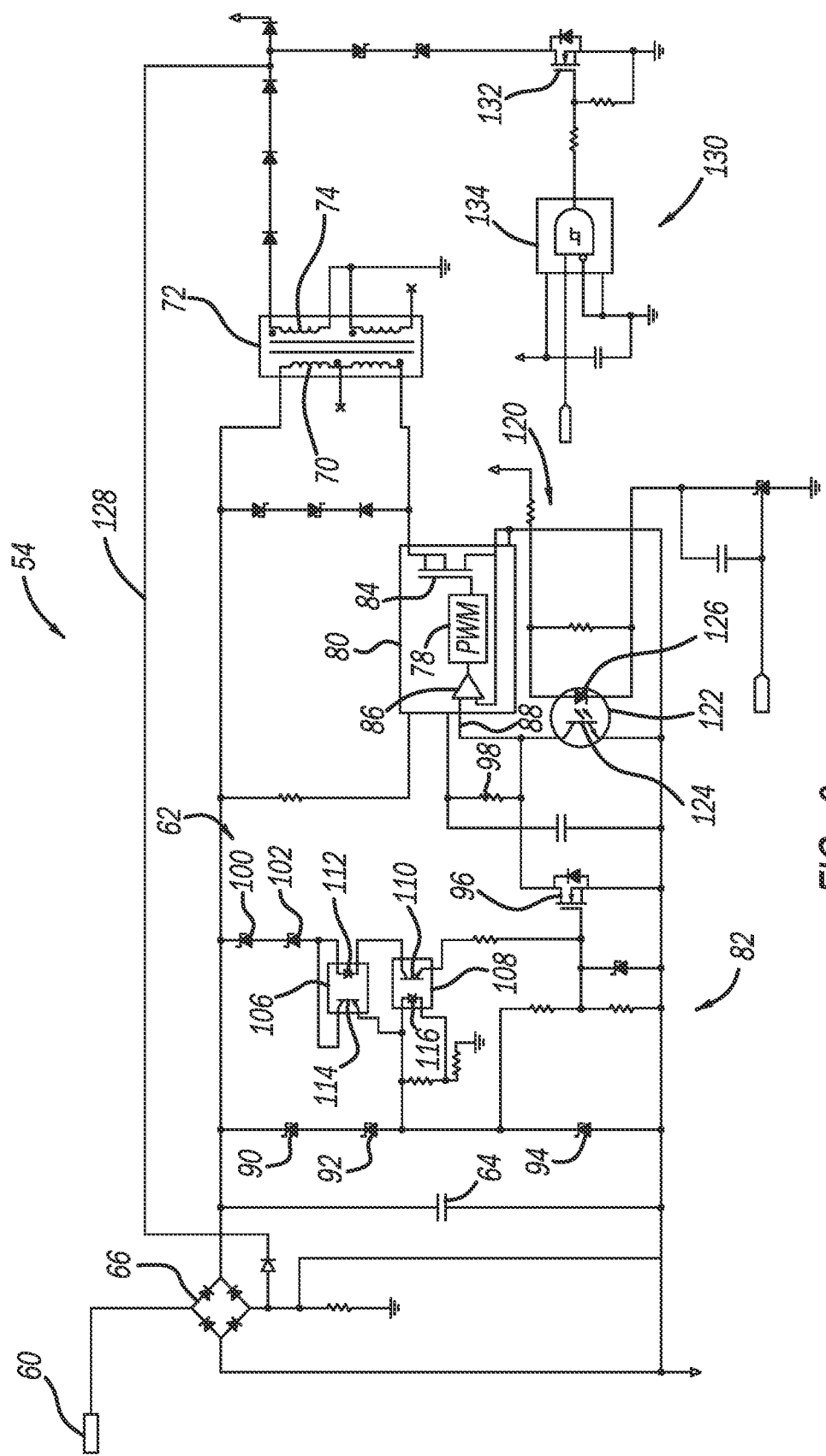
FIG. 3 is a schematic diagram of a switching circuit in the energy harvesting circuit shown in FIG. 2.

FIG. 3 is a detailed schematic diagram of the current harvesting circuit 54 that includes a number of features for regulating the input voltage provided to the primary coil 70 of the converter 72 with a minimal number of components. Since the input current is constant, regulating the input voltage continuously at its maximum value results in maximum power harvesting to control the actuator 56. The switching circuit 62 includes an input voltage regulation feedback circuit 82 having an integrated circuit (IC) 80 including a MOSFET switch 84 that controls whether the switching circuit 62 is open or closed, a voltage comparator 86 with a positive input connected to an internal reference voltage (referenced to GND) and a negative input connected to a feedback pin (FB) 88, and a pulse width modulation (PWM) controller 78 that generates a PWM signal that turns on the MOSFET switch 84. The IC 80 is self-powered from the input voltage generated across the input capacitor 64, which is charged through the full-bridge diode rectifier 66. The IC 80 works in an on-off control mode where a feedback voltage on the feedback pin 88 determines when to turn on or turn off the MOSFET switch 84. When the feedback voltage at the feedback pin 88 is below a reference voltage, a "high" signal is generated at the output of the comparator 86. This logic high triggers the PWM controller 78 to generate the PWM signal that operates the MOSFET switch 84. When the feedback voltage at the feedback pin 88 is above the reference voltage, it typically is an indication that the output voltage of the converter 72 is above the targeted output voltage set by an external feedback circuit (not shown) and the PWM signal is stopped.

The input feedback circuit 82 also includes a set of series-connected transient voltage suppression (TVS) diodes 90, 92 and 94 that are electrically coupled in parallel with the input capacitor 64 with the voltage regulation setpoint controlled by the breakdown voltage of the diodes 90 and 92. When the input voltage across the capacitor 64 is higher than the overall breakdown voltage of the TVS diodes 90 and 92, and enough voltage is developed across the gate-source terminals of a MOSFET switch 96, the switch 96 will turn on, which pulls down the feedback pin 88. At this voltage, the PWM controller 78 is enabled to operate the MOSFET switch 84 and the converter 72 starts to transfer energy from the input capacitor 64 to the secondary winding 74, thus charging the storage capacitor 76 until the input voltage drops to the point where the MOSFET switch 96 is turned off. When the input voltage falls below the threshold where the diodes 90 and 92 breakdown, the feedback pin 88 is pulled up through a resistor 98 to the VDD voltage of 5V, i.e., the internal supply voltage of the IC 80, and power transfer stops. Consequently, the input capacitor 64 starts to charge up again until the PWM operation is enabled and the cycle repeats. In this scheme, however, there is no control over the minimum energy transfer from the input capacitor 64. Once the capacitor voltage falls below the breakdown voltage of the diodes 90 and 92, the MOSFET 96 turns off, which disables the power transfer.

The energy harvesting circuit 54 can introduce hysteresis to the input voltage across the capacitor 64, which enables control over the minimum input voltage value. By including another set of series-connected TVS diodes 100 and 102 in the switching circuit 62, which have a lower overall breakdown voltage than the sum of the breakdown voltage of the diodes 90 and 92 and that is equal to the desired minimum value of the input voltage, i.e., the low threshold, and including two optoisolator switches 106 and 108, a hysteresis band is formed to control the input voltage. Once the input capacitor 64 is charged to a voltage higher than the sum of the breakdown voltages of the diodes 90 and 92, i.e., the high threshold, a phototransistor 110 in the optoisolator switch 108 conducts providing a path for current to flow in an LED 112 in the optoisolator switch 106. Consequently, a phototransistor 114 in the optoisolator switch 106 provides a latch for an LED 116 in the optoisolator switch 108, which continues to drive the MOSFET switch 96 when the input voltage falls below the high threshold, but is still higher than the low threshold, which is the sum of the breakdown voltages of the diodes 100 and 102.

While the customized use of the feedback pin 88 on the IC 80 to solve the current-source energy-harvesting issues discussed above is unique to this converter design, it does not preclude using the feedback pin 88 to regulate the output voltage of the capacitor 76, if desired. An advantage of using the feedback pin 88 to control the input voltage is that an independent output voltage regulation feedback circuit 120 can be provided in parallel with the input feedback circuit 82 for regulating the output voltage of the output capacitor 76. To maintain primary-to-secondary isolation, an optoisolated transistor 122 including a bipolar junction transistor 124 and an LED 126 is used, but it is simply connected to the feedback pin 88 directly in parallel with the input feedback circuit 82. When the output voltage on the capacitor 76 begins to exceed its setpoint, the bipolar junction transistor 124 will begin to conduct, which turns off the power transfer from the primary coil 70 to the secondary coil 74 by discharging the capacitor 64 completely. The remainder of the circuit 120 is a standard method of providing control in an off-line switcher application.

The output capacitor 76 can also be directly charged through the rectifier 66 on line 128 instead of through the converter 72. When that is occurring, the capacitor 76 can be prevented from being overcharged by a voltage clamp circuit 130 that includes a MOSFET switch 132 and a MOSFET driver 134 receiving commands from a microcontroller (not shown). When the sensed output voltage of the capacitor 76 reaches a setpoint of, for example, 700V, the microcontroller sends a turn-on command to the driver 134 which turns on the MOSFET switch 132, which clamps the output voltage to the setpoint. If the output voltage regulation feedback circuit 120 is not employed, the circuit 130 can also crowbar the flyback converter 72 and prevent it from further charging the output capacitor 76.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An energy harvesting circuit for harvesting energy from a power line to provide power to an actuator to close a vacuum interrupter, the energy harvesting circuit comprising:
   an input capacitor electrically coupled to the power line and storing energy therefrom;
   a power converter including a primary coil and a secondary coil;
   a switching circuit electrically coupled in series with the primary coil and the combination of the primary coil and the switching circuit being electrically coupled in parallel with the input capacitor, the switching circuit being operable to electrically connect and disconnect the input capacitor to and from the primary coil, the switching circuit including an input voltage regulation feedback circuit for regulating an input voltage provided to the switching circuit from the input capacitor, the input voltage regulation feedback circuit including an integrated circuit having a feedback pin, a first switch, a pulse width modulation (PWM) controller and a comparator, wherein when a feedback voltage provided to the feedback pin is below a reference voltage, a high signal is generated at an output of the comparator, which triggers the PWM controller to generate a PWM signal that turns on the first switch so that power is provided to the primary coil from the input capacitor, and when the feedback voltage at the feedback pin is above the reference voltage, the PWM signal is stopped; and an output capacitor electrically coupled to the secondary coil and the actuator, the output capacitor being charged by the secondary coil when the switching circuit is closed to provide power to the actuator to close the vacuum interrupter, wherein the input voltage regulation feedback circuit further includes a first set of series-connected transient voltage suppression (TVS) diodes that are electrically coupled in parallel with the input capacitor and a second switch, the first set of series-connected TVS diodes controlling an input voltage regulation setpoint at the feedback pin to be equal to the series breakdown voltage of the first set of series-connected TVS diodes, wherein when the input voltage across the input capacitor is higher than the overall breakdown voltage of the first set of series-connected TVS diodes, the second switch will turn on which pulls down the feedback pin, which triggers the PWM controller.

2. The energy harvesting circuit according to claim 1 wherein the switching circuit further includes a second set of series-connected TVS diodes that have a lower breakdown voltage than the first set of series-connected TVS diodes and that is equal to a desired minimum value of the input voltage, and includes two optoisolator switches each having a phototransistor and an LED, wherein when the input capacitor is charged to a voltage higher than the sum of the breakdown voltages of the first set of series-connected TVS diodes, the phototransistor in one of the optoisolator switches conducts providing a path for current to flow in the LED in the other optoisolator switch, the phototransistor in the other optoisolator switch provides a latch for the LED in the one optoisolator switch, which drives the second switch.

3. The energy harvesting circuit according to claim 1 wherein the first and second switches are MOSFET switches.

4. The energy harvesting circuit according to claim 1 wherein the switching circuit further includes an output voltage regulation feedback circuit for regulating the output voltage on the output capacitor, the output feedback circuit including an optoisolated transistor coupled to the feedback pin, the optoisolated transistor including a bipolar junction transistor and an LED, wherein when the output voltage on the output capacitor begins to exceed a predetermined setpoint, the bipolar junction transistor will begin to conduct, which turns off the power transfer from the primary coil to the secondary coil by completely discharging the input capacitor.

5. The energy harvesting circuit according to claim 1 further comprising a voltage clamp circuit for controlling the output voltage of the output capacitor, the voltage clamp circuit including a MOSFET switch and a microcontroller wherein when the sensed output voltage of the output capacitor reaches a predetermined setpoint, the microcontroller turns on the MOSFET switch, which prevents the power converter from further charging the output capacitor.

6. The energy harvesting circuit according to claim 1 wherein the power converter is a flyback converter.

7. The energy harvesting circuit according to claim 1 wherein the input and output capacitors are film capacitors.

8. The energy harvesting circuit according to claim 1 wherein the energy harvesting circuit and the vacuum interrupter are part of a recloser.

9. The energy harvesting circuit according to claim 8 wherein the recloser is a cut-out mounted recloser.

10. The energy harvesting circuit according to claim 8 wherein the recloser is a single phase self-powered magnetically actuated recloser.

11. The energy harvesting circuit according to claim 8 wherein the recloser is associated with a distribution transformer.

12. An energy harvesting circuit for harvesting energy from a power line to provide power to an actuator to close a vacuum interrupter associated with a recloser, the energy harvesting circuit comprising:

an input capacitor electrically coupled to the power line and storing power therefrom;

a flyback converter including a primary coil and a secondary coil;

a switching circuit electrically coupled in series with the primary coil and the combination of the primary coil and the switching circuit being electrically coupled in parallel with the input capacitor, the switching circuit being operable to electrically connect and disconnect the input capacitor to and from the primary coil, the switching circuit including an input voltage regulation feedback circuit for regulating an input voltage provided to the switching circuit from the input capacitor;

an output capacitor electrically coupled to the secondary coil and the actuator, the output capacitor being charged by the secondary coil when the switching circuit is closed to provide power to the actuator to close the vacuum interrupter;

wherein the input voltage regulation feedback circuit includes an integrated circuit having a feedback pin, a first MOSFET switch, a pulse width modulation (PWM) controller and a comparator, wherein when a feedback voltage provided to the feedback pin is below a reference voltage, a high signal is generated at an output of the comparator, which triggers the PWM controller to generate a PWM signal that turns on the first switch so that power is provided to the primary coil from the input capacitor, and when the feedback voltage at the feedback pin is above the reference voltage, the PWM signal is stopped; and wherein the input voltage regulation feedback circuit further includes a first set of series-connected transient voltage suppression (TVS) diodes that are electrically coupled in parallel with the input capacitor and a second switch, the first set of series-connected TVS diodes controlling an input voltage regulation setpoint at the feedback pin to be equal to the series breakdown voltage of the first set of series-connected TVS diodes, wherein when the input voltage across the input capacitor is higher than the overall breakdown voltage of the first set of series-connected TVS diodes, the second switch will turn on which pulls down the feedback pin, which triggers the PWM controller.

13. The energy harvesting circuit according to claim 12 wherein the switching circuit further includes a second set of series-connected TVS diodes that have a lower breakdown voltage than the first set of series-connected TVS diodes and that is equal to a desired minimum value of the input voltage, and includes two optoisolator switches each having a phototransistor and an LED, wherein when the input capacitor is charged to a voltage higher than the sum of the breakdown voltages of the first set of series-connected TVS diodes, the phototransistor in one of the optoisolator switches conducts providing a path for current to flow in the LED in the other optoisolator switch, the phototransistor in the other optoisolator switch provides a latch for the LED in the one optoisolator switch, which drives the second MOSFET switch.

14. The energy harvesting circuit according to claim 12 wherein the switching circuit further includes an output voltage regulation feedback circuit for controlling the output voltage of the output capacitor, the output feedback circuit including an optoisolated transistor coupled to the feedback pin, the optoisolated transistor including a bipolar junction transistor and an LED, wherein when the output voltage on the output capacitor begins to exceed a predetermined setpoint, the bipolar junction transistor will begin to conduct, which turns off the power transfer from the primary coil to the secondary coil by completely discharging the input capacitor.

15. The energy harvesting circuit according to claim 12 further comprising a voltage clamp circuit for controlling the output voltage of the output capacitor, the voltage clamp circuit including a MOSFET switch and a microcontroller, wherein when the sensed output voltage of the output capacitor reaches a predetermined setpoint, the microcontroller turns on the MOSFET switch, which prevents the power converter from further charging the output capacitor.

16. The energy harvesting circuit according to claim 12 wherein the input and output capacitors are film capacitors.

17. An energy harvesting circuit for harvesting energy from a power line to provide power to an actuator to close a vacuum interrupter, the energy harvesting circuit comprising:
an input film capacitor electrically coupled to the power line and storing power therefrom;
a flyback converter including a primary coil and a secondary coil;
a switching circuit electrically coupled in series with the primary coil and the combination of the primary coil and the switching circuit being electrically coupled in parallel with the input capacitor, the switching circuit being operable to electrically connect and disconnect the input capacitor to and from the primary coil, the switching circuit including an input voltage regulation feedback circuit for regulating an input voltage provided to the switching circuit from the input capacitor;
an output film capacitor electrically coupled to the secondary coil and the actuator, the output capacitor being charged by the secondary coil when the switching circuit is closed to provide power to the actuator to close the vacuum interrupter; and
a voltage clamp circuit for controlling the output voltage of the output capacitor, the voltage clamp circuit including a MOSFET switch and a microcontroller, wherein when the sensed output voltage of the output capacitor reaches a predetermined setpoint, the microcontroller turns on the MOSFET switch, which prevents the power converter from further charging the output capacitor.

* * * * *